(12) United States Patent
Ghillino et al.

(10) Patent No.: US 12,717,994 B1
(45) Date of Patent: Aug. 25, 2026

(54) CACHING OUTPUTS OF COMPONENTS IN SIGNAL-FLOW-BASED SIMULATIONS

(71) Applicant: Synopsys, Inc., Mountain View, CA (US)

(72) Inventors: Enrico Ghillino, New York, NY (US); Pablo Valente Mena, Chicago, IL (US)

(73) Assignee: Synopsys, Inc., Sunnyvale, CA (US)

( * ) Notice: Subject to any disclaimer, the term of this patent is extended or adjusted under 35 U.S.C. 154(b) by 736 days.

(21) Appl. No.: 18/301,491

(22) Filed: Apr. 17, 2023

(51) Int. Cl.
*G06F 30/367* (2020.01)
*G06F 30/31* (2020.01)
*G06F 30/398* (2020.01)

(52) U.S. Cl.
CPC ............ *G06F 30/367* (2020.01); *G06F 30/31* (2020.01); *G06F 30/398* (2020.01)

(58) Field of Classification Search
CPC .................................................... G06F 30/367
USPC ........................................................ 716/106
See application file for complete search history.

(56) References Cited

U.S. PATENT DOCUMENTS

| | | | | |
|---|---|---|---|---|
| 8,453,102 | B1 * | 5/2013 | Pack | G06F 30/327 716/139 |
| 2023/0052816 | A1 * | 2/2023 | Adolf | G06F 30/20 |
| 2023/0186005 | A1 * | 6/2023 | Vermeulen | G06F 30/3308 716/100 |

* cited by examiner

*Primary Examiner* — Eric D Lee
(74) *Attorney, Agent, or Firm* — Fenwick & West LLP

(57) ABSTRACT

A photonic integrated circuit (PIC) may be simulated by executing multiple iterations. Each iteration estimates outputs of the components in the PIC from inputs to the components. At least one output is estimated by running a simulation of the component. For at least one component and one iteration, the input for the current iteration is compared against a cached input for the component. Based on the comparison, it is determined whether to retrieve a corresponding cached output for the component or to run the simulation of the component.

20 Claims, 9 Drawing Sheets

CACHING OUTPUTS OF COMPONENTS IN SIGNAL-FLOW-BASED SIMULATIONS

TECHNICAL FIELD

The present disclosure relates to signal-flow-based simulations, including simulations of photonic integrated circuits.

BACKGROUND

Signal-flow-based simulations are simulations of a system which are implemented by modeling the signal flow through components of the system. Photonic integrated circuits are one type of system that may be simulated using signal-flow-based simulations.

A photonic integrated circuit is a device that integrates optical components on a single device and processes the information signals in the form of light waves. Photonic integrated circuits are designed and fabricated using tools and processes based on the semiconductor electronics industry. For example, design flows analogous to those used to design electronic integrated circuits may be used to design photonic integrated circuits. Software tools for the layout of the devices and for the generation of masks used in fabrication may also be similar to those used in the electronics industry. Semiconductor processes used to fabricate electronic devices may be used or adapted to fabricate photonic integrated circuits.

In many cases, photonic integrated circuits may combine photonics and electronics on the same device. For example, some functions may be performed by photonics and others by electronics. Devices such as lasers and other types of optical transmitters may be used to convert signals from electrical to optical form, and devices such as sensors and other types of optical receivers may be used to convert signals from optical to electrical form. Electrical signals may also be used to control photonic devices, such as electro-optic modulators and optical amplifiers.

SUMMARY

In some aspects, a schematic design of a photonic integrated circuit (PIC) specifies components in the design and connections between the components. The PIC may be simulated by executing multiple iterations of estimating the signal propagation of an input stimulus through the PIC. Each iteration estimates outputs of the components from inputs to the components, in an order determined by signal flow through the connections in the design. At least one output is estimated by running a simulation of the component. For at least one component and one iteration, the input for that iteration is compared against a cached input for the component. Based on the comparison, it is determined whether to retrieve a corresponding cached output for the component or to run the simulation of the component.

Other aspects include components, devices, systems, improvements, methods, processes, applications, computer readable mediums, and other technologies related to any of the above.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Aspects of the present disclosure relate to caching outputs of components in signal-flow-based simulations. In a signal-flow-based simulation, the system being simulated is represented by its components and the signal flow through the components is modeled. Photonic integrated circuits (PICs), multi-PIC systems, fiber-optic communication systems, and microwave electronics are just some examples of systems that may be evaluated using signal-flow-based simulations. PICs are used in the following description to illustrate various aspects, but the present techniques are not limited to PICs.

PICs may combine electrical, optical and electro-optic components in a die or multi-die design. The schematic design of a PIC specifies the different components in the PIC and how they are connected to each other. Each component has an input (which may include multiple input signals) and generates an output (which also may include multiple output signals) based on the function of that component.

One approach to simulating the operation of a PIC is a signal-flow-based simulation. In this approach, each component in the circuit is simulated by taking the signals at its input, and executing a model of that component to produce the estimated signals at the output of the component. The components are analyzed starting with the components that receive the input stimulus applied to the PIC and progressing through the PIC as the inputs to each component become available.

In some cases, the simulation may be run for multiple iterations. For example, if the PIC has feedback, then the simulation may be performed iteratively until convergence on a solution is reached. As another example, the operation of the PIC may be parameterized and iterations may be run for different values of the parameters. When multiple iterations are run, each component is simulated once for each iteration. Some situations may include nested loops. For example, an outer loop may scan across different parameter values, and an inner loop is used for convergence.

However, the simulation of an individual component may be computationally expensive. If the conditions around the component do not change from one iteration to the next, re-simulating the component under the same conditions just duplicates a simulation that was already run for a previous iteration. If the output from the previous iteration is cached, it may be retrieved from the cache rather than re-simulating the component. In one approach, the input to the component is compared to previously cached inputs. If they are sufficiently similar, then the corresponding output is retrieved from the cache rather than re-simulating the component.

Technical advantages of the present disclosure include, but are not limited to, the following. Compute resources and simulation time are reduced by caching outputs from previous iterations, and then retrieving these cached outputs rather than running additional duplicate simulations.

Figure 1:
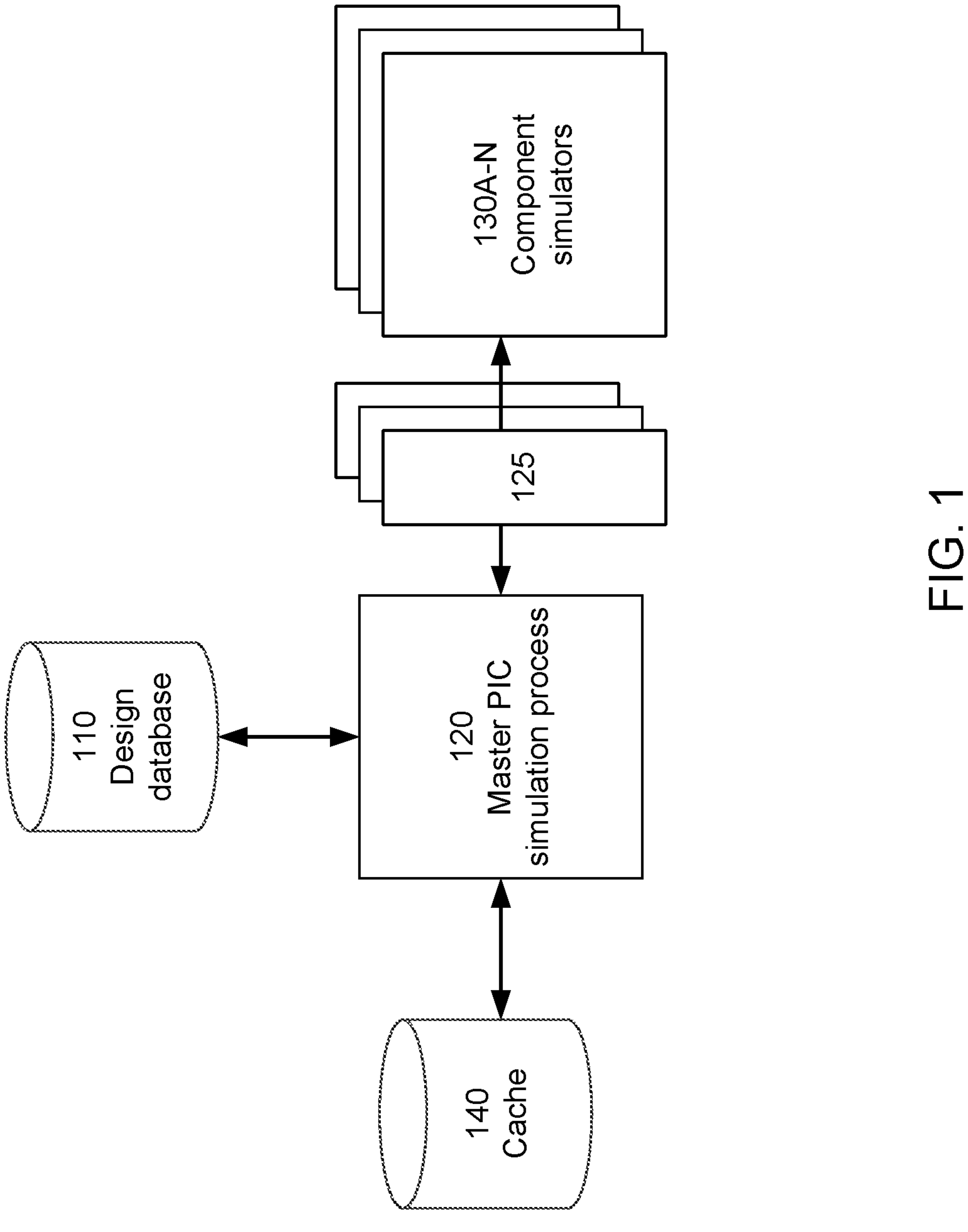
FIG. 1 is a block diagram of a PIC simulation system according to embodiments of the present disclosure.

FIG. 1 is a block diagram of a PIC simulation system according to embodiments of the present disclosure. The system includes a design database 110, a master PIC simulation process 120, different component simulators 130A-N, and a cache 140 of results from previous component simulations.

The design database 110 contains a schematic design of the PIC that is simulated. The schematic design specifies the components in the PIC and the connections between the components. The components may be electrical components (the input and output are all electrical), optical components (the input and output are all optical), and/or electro-optical components (the input and output are a combination of electrical and optical). Examples of electrical components include electrical amplifiers, A/D and D/A converters, filters, transmission lines, electrical connectors, electrical drivers, SERDES components and other digital, analog and mixed-signal electrical circuits. Examples of optical components include waveguides, full and partial mirrors, optical filters, optical multiplexers and demultiplexers, and optical ring resonators. Examples of electro-optical components include lasers and LEDs, external electro-optic modulators, Mach-Zehnder modulators, optical detectors and receivers, phase shifters, and ring modulators.

The component simulators 130 are used to simulate individual components. For example, SPICE, HSPICE, FastSPICE and other circuit simulators may be used to simulate electrical components. Programming platforms such as MATLAB may be used for electrical, photonic, and electro-photonic modeling. Electrical and photonic device-level simulators, and optical ray tracing tools are examples of other component simulators.

The simulators 130 for different components may be based on different approaches. For example, some simulators 130 may be time-based while others are frequency-based. The simulation domains may be different, for example electrical vs optical vs electro-optic. Different simulators may also use different methodologies: nodal-matrix based for SPICE, physics-based for highly accurate device simulation, and ray-tracing for optical simulations. The simulators 130 may be separate software processes or tools that are called by the master process 120 via interface (s) 125. The master process 120 may also include component simulators.

The cache 140 contains inputs and corresponding outputs generated from previous component simulations. The cache 140 may contain multiple pairs of inputs and outputs for a component. Alternatively, it may contain only one pair of input and corresponding output for a component, for example from the most recent simulation of that component.

Figure 2:
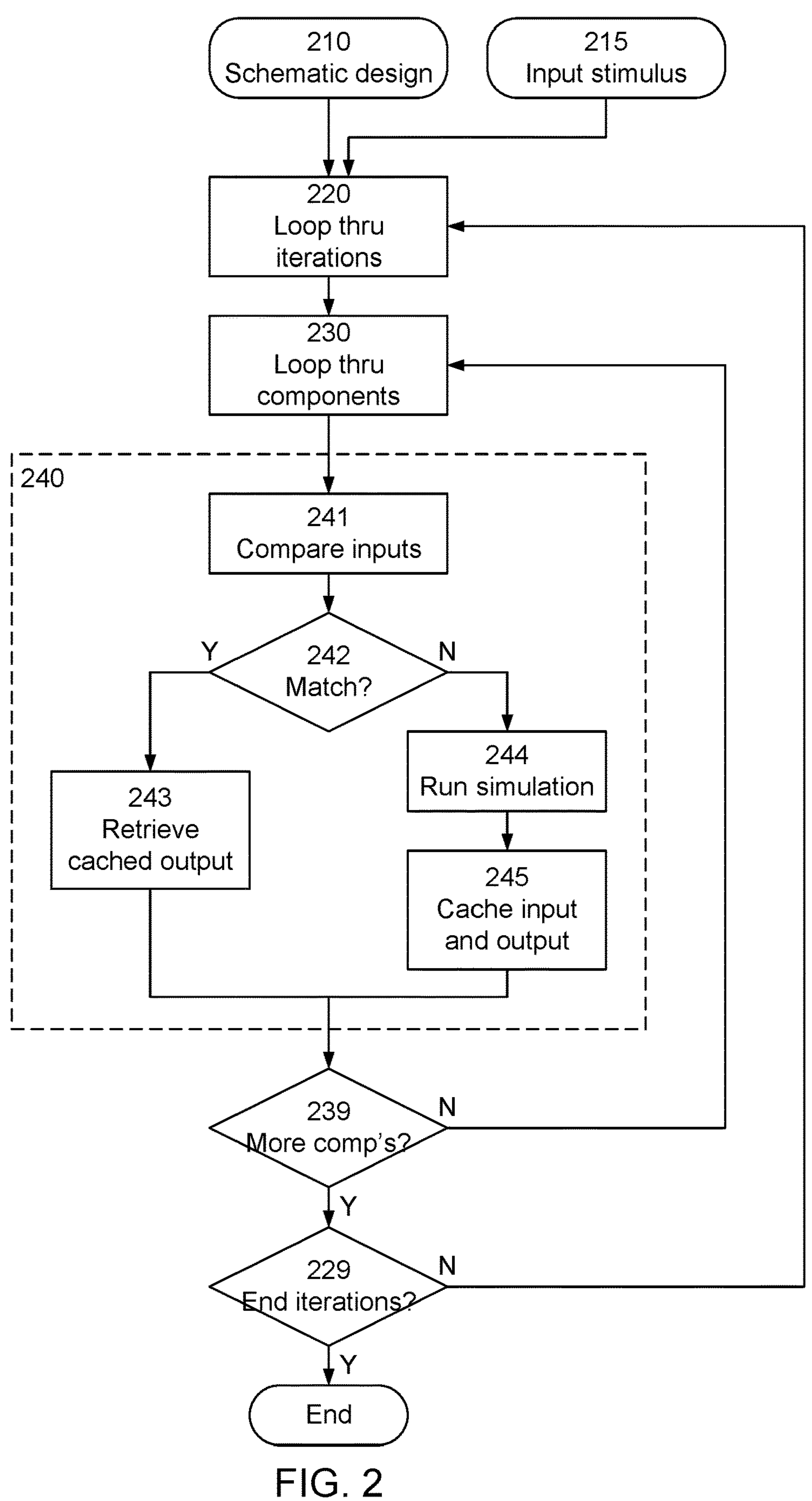
FIG. 2 is a flow diagram of PIC simulation according to embodiments of the present disclosure.

Master process 120 implements a cache-based simulation of the PIC. FIG. 2 is a flow diagram of a PIC simulation that may be run by master process 120. The flow estimates the signal propagation of an input stimulus 215 through the PIC specified by schematic design 210. The flow includes multiple iterations, as indicated by the loop defined by 220 and 229. Each iteration estimates the signal propagation through the PIC. Each iteration does so by traversing the components in the PIC, as indicated by the loop defined by 230 and 239. The order of traversal is determined by signal flow, as defined by the connections in the schematic design. When all of the inputs to a component are available, that component may be simulated. This produces the output of the component, which are then inputs to later components. For each component, the body 240 of the loops estimates the output of the component from the input to the component.

For at least some iterations and some components, the flow determines whether to use a cache output or to run a simulation of the component. At 241, the current input to the component is compared to cached inputs (from cache 140). At 242-243, if there is a match (cache hit), then the corresponding output is retrieved from the cache 140. In some cases, cache hit/miss will also depend on matching component parameters or simulation parameters in addition to the component input. At 242-244, if there is not a match (cache miss), then the simulation of the component is run. At 245, the resulting output and corresponding input (and other parameters) may also be cached for future iterations. For each iteration, the inner loop 230-239 continues until the PIC is traversed and all components in the PIC have been considered. Normally, each component in the PIC will be considered once per iteration.

The determination at 242 may be based on some measure of similarity of the quantities being compared, for example the similarity between the current and cached inputs, component or simulation parameters, and/or other factors. Using inputs as an example, the measure of similarity may be based on an average difference between the two inputs. Alternatively, the measure may be based on a peak difference between the two inputs. The measure may be either an absolute measure or a relative measure. It may be time-domain or frequency-domain. It may also be user-defined. The determination at 242 may be based strictly on comparison of the relative quantities, without considering the topology of the components and their connections.

The iterations 220-229 continue until some end criteria is reached. If the PIC has feedback, then multiple iterations may be run until the solution converges as explained in the examples below. The convergence may be based on different quantities. It may be based on the convergence of the inputs and outputs to certain components within the PIC. It may also be based on the convergence of simulation results, such as the output signal of the PIC or various metrics for the PIC. Whatever the underlying quantity, the convergence criteria may be based on an absolute change of that quantity or on a relative change of that quantity. Rate of change may also be used. In some cases, the iterations may end after a set number of iterations.

Figure 3A:
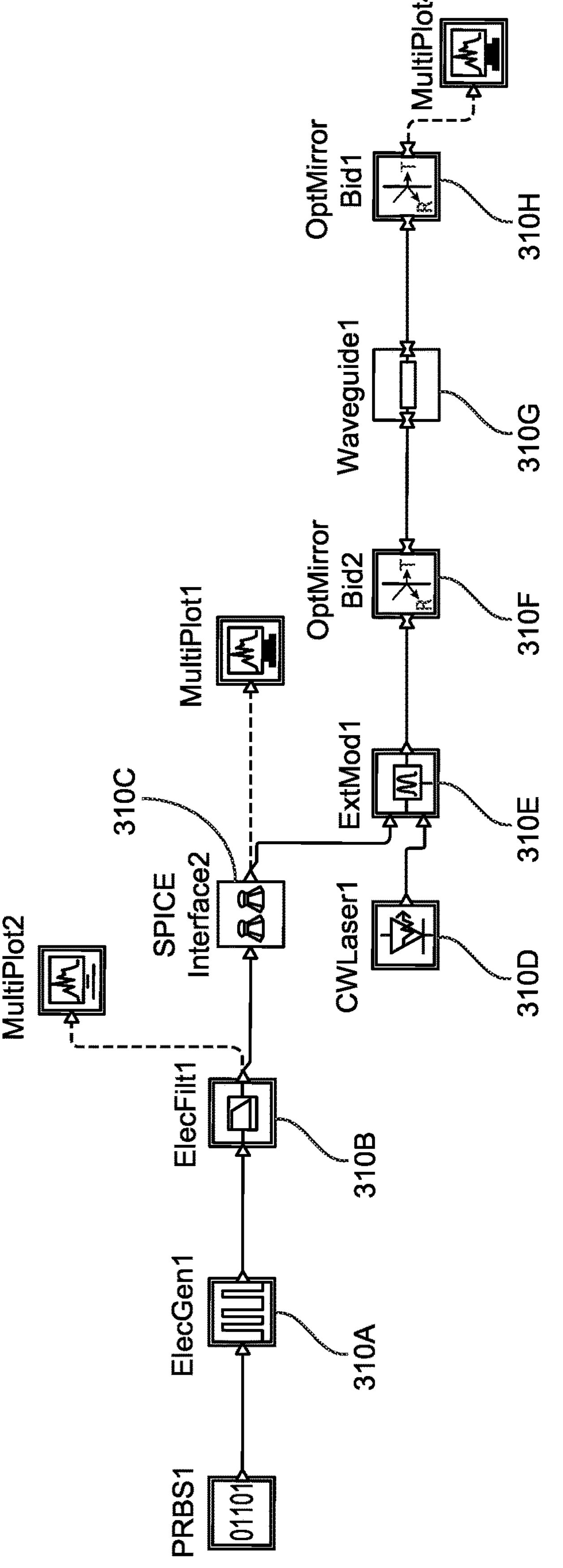
FIG. 3A is a schematic layout of a PIC with feedback according to embodiments of the present disclosure.
Figure 3B:
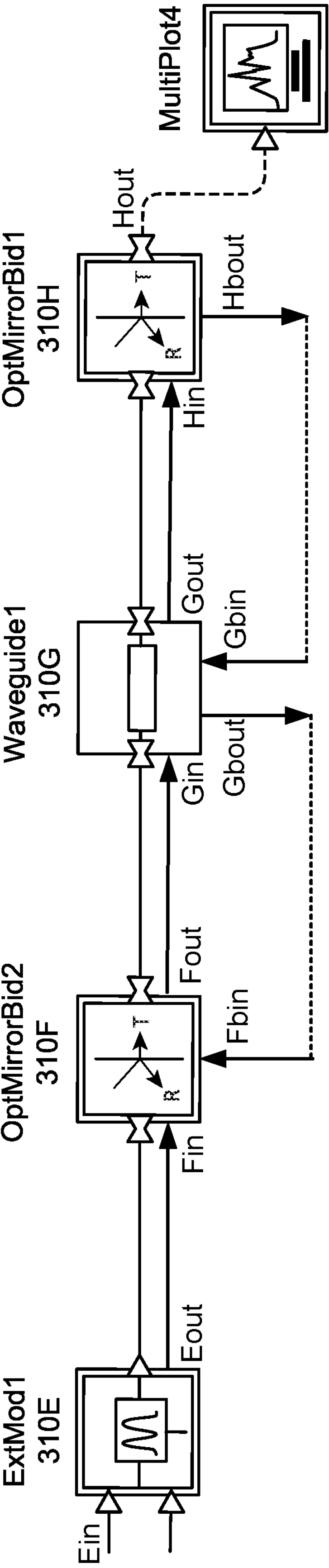
FIG. 3B is a diagram of the feedback section of FIG. 3A according to embodiments of the present disclosure.
Figure 3C:
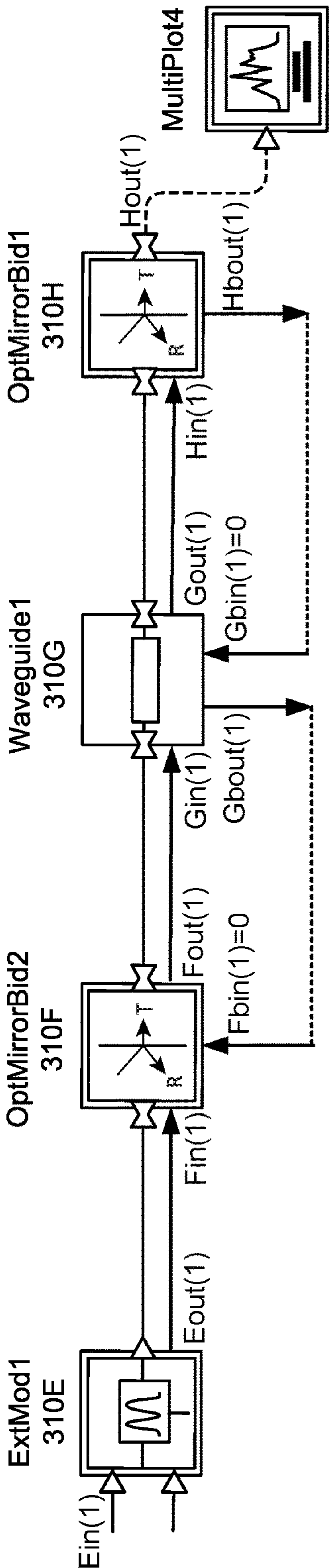
FIGS. 3C and 3D are diagrams of a first and second iteration of PIC simulation applied to the diagram of FIG. 3B.
Figure 3D:
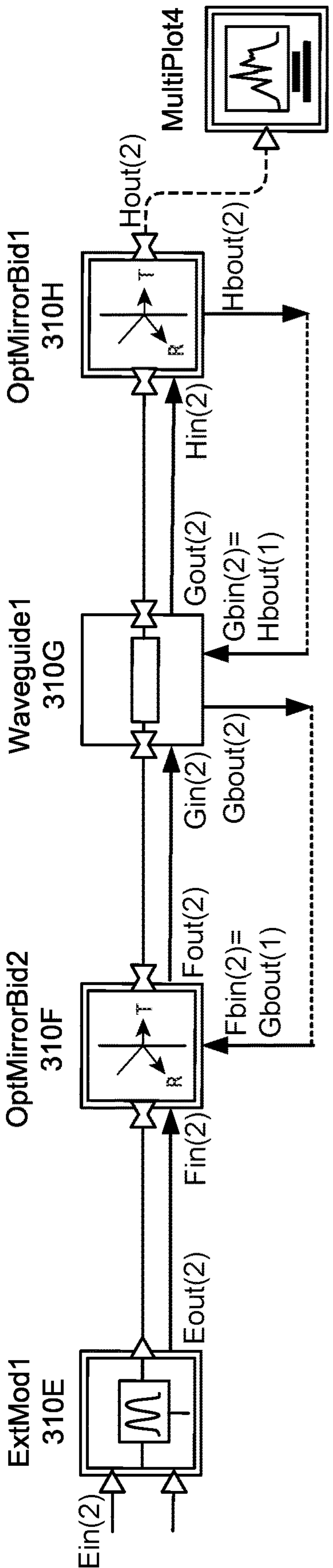
Figure 4:
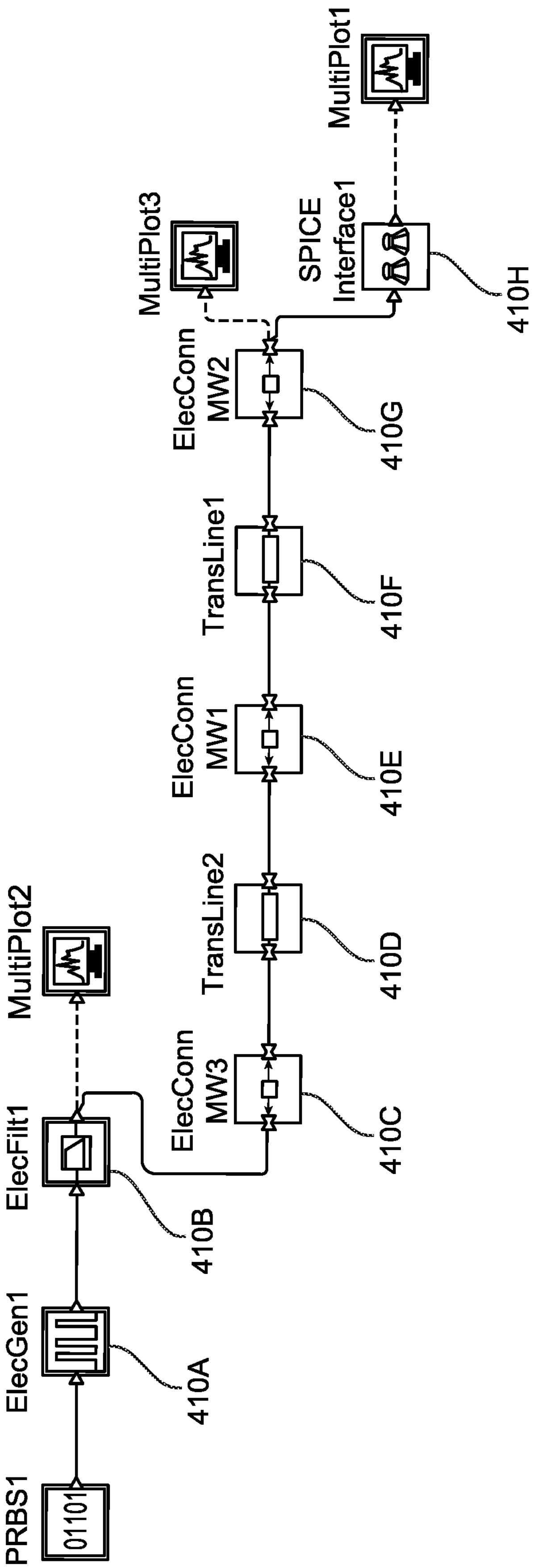
FIG. 4 is a schematic layout of a microwave circuit with feedback according to embodiments of the present disclosure.

FIGS. 3 and 4 show two examples of PICs that contain feedback. Feedback can be the result of an express feedback path or feedback loop. A bidirectional connection is also a form of feedback. A bidirectional connection between two components A and B is a feedforward connection from component A to component B, plus a feedback connection from component B to component A.

In FIG. 3A, PRBS1 is the input stimulus, which is a digital sequence of bits. The PIC in FIG. 3A includes the following components. ElecGen1 (component 310A) is a D/A converter. ElecFilt1 (310B) is an analog filter. SpiceInterface2 (310C) is a block that calls a SPICE simulator to simulate an electrical portion of the schematic, as described in a netlist. CWLaser1 (310D) is a continuous wave laser. ExtMod1

(310E) is an external modulator, which modulates the laser beam from CWLaser1 based on the output signal of SpiceInterface2. OptMirrorBid2 (310F) is a partial mirror. Waveguide1 (310G) is a waveguide. OptMirrorBid1 (310H) is another partial mirror. The structure of mirror 310F-waveguide 310G-mirror 310H form an optical cavity.

The MultiPlot boxes in FIG. 3A represent probes added for simulation results. MultiPlot2 records the output of ElectFilt1. MultiPlot1 records the output from SpiceInterface 2. MultiPlot4 records the output from OptMirrorBid1.

The components 310A-H are lettered in order of the signal flow. The input stimulus PRBS1 flows to component 310A to 310B to 310C to 310E to 310F to 310G to 310H. There is also signal flow from component 310D to 310E.

FIG. 3B shows components 310E-H of the PIC of FIG. 3A, but with the feedback loops separated from the feedforward signal paths. For each component 310X, Xin and Xout are the input and output to that component along the feedforward signal path. Xbout is the output of that component for a feedback path, and Xbin is an input to that component from a feedback path.

For example, the bidirectional connection between 310F and 310G is separated into a feedforward connection from 310F to 310G and a feedback connection from 310G to 310F. For the feedforward connection, component 310F produces feedforward output Fout, and component 310G receives that signal as its feedforward input Gin. For the feedback path, component 310G produces feedback output Gbout, which is fed back as feedback input Fbin to component 310F. The same is shown for the bidirectional connection between 310G and 310H. The feedforward path is from Gout to Hin. The feedback path is from Hbout to Gbin. Note that the input to component 310G includes both signals Gin and Gbin, and the output includes both signals Gout and Gbout.

FIG. 3C summarizes a first iteration of the PIC simulation. The parenthesis ( ) indicate the iteration number. Referring to FIG. 3A, the input stimulus is propagated to component 310A as its input, and simulation of component 310A produces the output of component 310A. This is propagated to component 310B, and simulation of component 310B produces its output. The signal flows in this manner to component 310E of FIG. 3C.

FIG. 3C shows one of the two inputs Ein to component 310E. The input Ein is the SPICE output from component 310C (see FIG. 3A). It is labeled Ein(1) because this is the first iteration. Simulation of component 310E produces output Eout(1).

Components 310F-310H have feedback, which is simulated as follows. Component 310F has an input of Fin and Fbin. The output of component 310E is propagated to 310F so Fin(1)=Eout(1), but Fbin is not yet known so it is set to Fbin(1)=0. Component 310F is simulated with input signals of Fin(1)=Eout(1) and Fbin(1)=0, to yield Fout(1). Similarly, component 310G is simulated with input signals of Gin(1)=Fout(1) and Gbin(1)=0, to yield output signals of Gout(1) and Gbout(1). Component 310H is simulated with input signals of Hin(1)=Gout(1), to yield output signals of Hout(1) and Hbout(1). Certain inputs and outputs from this first iteration may be cached. In this example, the input and output of the SPICE interface are cached since the SPICE simulation (component 310C) is the slowest simulation.

FIG. 3D summarizes a second iteration of the PIC simulation. Before reaching the components in FIG. 3D, the input stimulus is propagated through components 310A-C, which are unchanged from the first iteration. At the SPICE component 310C, rather than re-simulating the SPICE component, the output of the component 310C is retrieved from the cache. This happens because a cached input/output pair for components 310C is available, and the current input is unchanged from the cached input. Cache retrieval could also be used for other components 310A-E.

Now turning to FIG. 3D, the input of component 310F includes Fin and Fbin. Fin(2)=Fin(1) but Fbin(2)≠Fbin(1). The feedback input Fbin takes the value of Gbout calculated during the previous iteration, so Fbin(2)=Gbout(1). Recall that Fbin(1)=0 so Fbin(2)≠Fbin(1). If the input/output to component 310F were cached, then comparing the current input to the cached input results in a cache miss. Component 310F is simulated to yield Fout(2). This changes the value of Gin (and Gbin is also changed), so simulation of component 310G is run to produce Gout(2) and Gbout(2). The input to component 310H is changed so simulation of 310H is also run. The iterations continue until the inputs and outputs to components 310F,G,H converge. During these iterations, simulations for components 310A-E do not have to be rerun if caching is available for these components, since their inputs do not change.

FIG. 4 shows a microwave circuit where the feedback is in the electrical signals, but the same approach is used. In this example, the components are a D/A converter ElecGen1 (410A), a filter ElecFilt1 (410B), a microwave connector ElecConnMW3 (410C), a transmission line TransLine2 (410D), a microwave connector ElecConnMW1 (410E), a transmission line TransLine1 (410F), a microwave connector ElecConnMW2 (410G), and a SpiceInterface1 (410H). The microwave section (components 410C-G) is bidirectional because reflections may be created and propagated. The bidirectional connections may be represented as feedback loops separated from the feedforward signal paths, as discussed above with respect to FIGS. 3B-3D.

Figure 5:
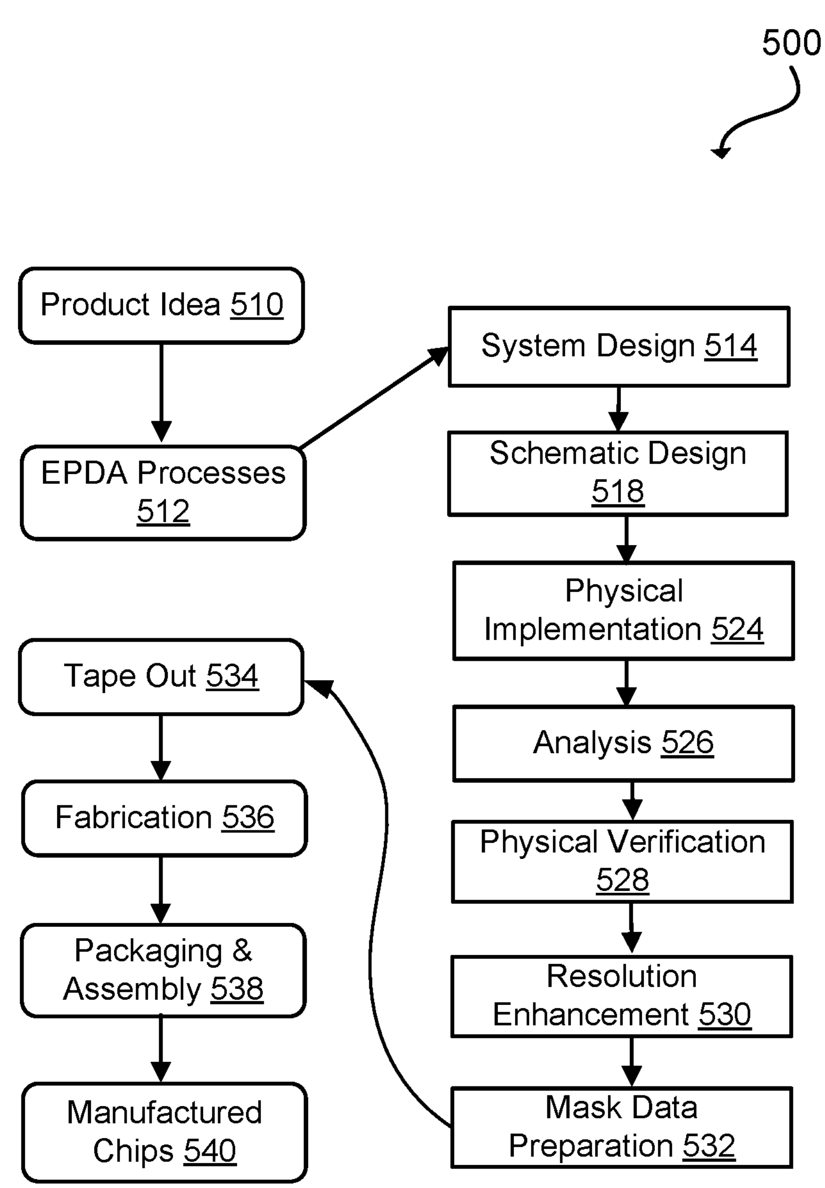
FIG. 5 is a flowchart of various processes used during the design and manufacture of a photonic integrated circuit in accordance with some embodiments of the present disclosure.

FIG. 5 illustrates an example set of processes 500 used during the design, verification, and fabrication of a photonic integrated circuit (PIC) to transform and verify design data and instructions that represent the PIC. Each of these processes can be structured and enabled as multiple modules or operations. The term 'EPDA' signifies the term 'Electronic Photonic Design Automation.' These processes start with the creation of a product idea 510 with information supplied by a designer, information which is transformed to create an article of manufacture that uses a set of EPDA processes 512. When the design is finalized, the design is taped-out 534, which is when artwork (e.g., geometric patterns) for the PIC is sent to a fabrication facility to manufacture the mask set, which is then used to manufacture the PIC. After tape-out, a die is fabricated 536 and packaging and assembly processes 538 are performed to produce the finished photonic integrated circuit 540.

Specifications may range from lower-level material and physical layouts to higher-level descriptions. Higher level descriptions can be transformed to lower level descriptions: product specifications to schematic to physical layout to mask-level descriptions, for example. Each lower abstraction level that is a less abstract description adds more useful detail into the design description, for example, more details for the modules that include the description. The lower levels of abstraction that are less abstract descriptions can be generated by a computer, derived from a design database, or created by another design automation process. Descriptions at each level of abstraction are enabled for use by the corresponding tools of that layer. A design process may use a sequence depicted in FIG. 5. The processes described may be enabled by EPDA products (or tools), although the steps in FIG. 5 focus on the photonic design steps.

During system design 514, functionality of a PIC to be manufactured is specified. The design may be optimized for desired characteristics such as power consumption, performance, area (physical and/or lines of code), and reduction of costs, etc. Partitioning of the design into different types of modules or components can occur at this stage.

During schematic design 518, higher level descriptions may be transformed to a netlist of components. In some embodiments, a netlist may be a graph structure where edges of the graph structure represent components of the PIC and where the nodes of the graph structure represent how the components are interconnected.

During layout or physical implementation 524, physical placement (positioning of circuit components such as described above) and routing (connection of the circuit components by waveguides) occurs.

During analysis 526, the circuit function is verified at the physical layout level, which permits refinement of the schematic and/or layout designs. During physical verification 528, the physical layout design is checked to ensure that manufacturing constraints are correct. During resolution enhancement 530, the geometry of the layout may be transformed to improve how the circuit design is manufactured.

During tape-out, data is created to be used (after lithographic enhancements are applied if appropriate) for production of lithography masks. During mask data preparation 532, the 'tape-out' data is used to produce lithography masks that are used to produce finished PICs.

A storage subsystem of a computer system (such as computer system 600 of FIG. 6) may be used to store the programs and data structures that are used by some or all of the EPDA products described herein, and products used for development of cells for the library and for physical and logical design that use the library.

Figure 6:
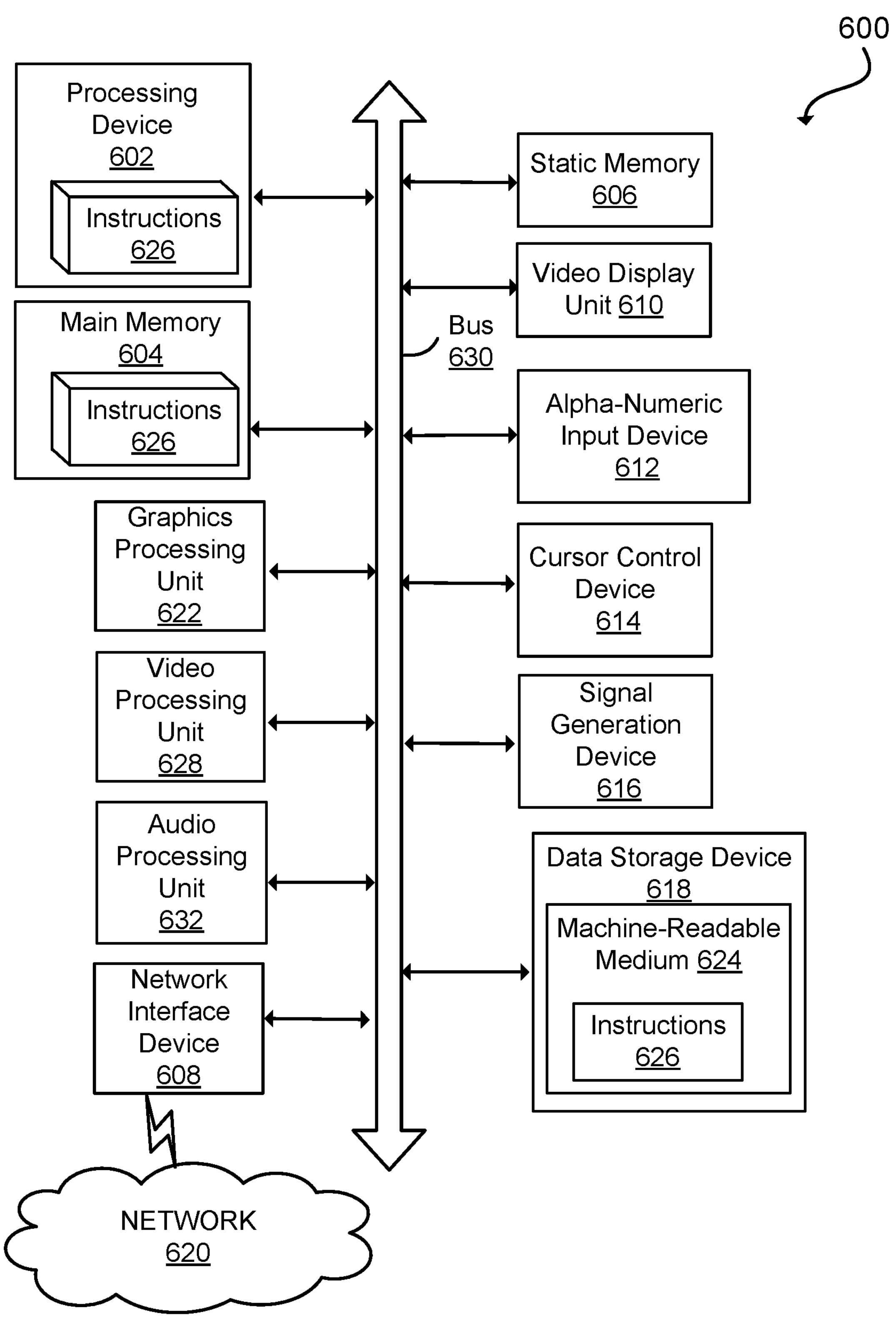
FIG. 6 is a diagram of an example computer system in which embodiments of the present disclosure may operate.

FIG. 6 illustrates an example machine of a computer system 600 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM), a static memory 606 (e.g., flash memory, static random access memory (SRAM), etc.), and a data storage device 618, which communicate with each other via a bus 630.

Processing device 602 represents one or more processors such as a microprocessor, a central processing unit, or the like. More particularly, the processing device may be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 may also be one or more special-purpose processing devices such as an application specific integrated circuit (ASIC), a field programmable gate array (FPGA), a digital signal processor (DSP), network processor, or the like. The processing device 602 may be configured to execute instructions 626 for performing the operations and steps described herein.

The computer system 600 may further include a network interface device 608 to communicate over the network 620. The computer system 600 also may include a video display unit 610 (e.g., a liquid crystal display (LCD) or a cathode ray tube (CRT)), an alphanumeric input device 612 (e.g., a keyboard), a cursor control device 614 (e.g., a mouse), a graphics processing unit 622, a signal generation device 616 (e.g., a speaker), a video processing unit 628, and an audio processing unit 632.

The data storage device 618 may include a machine-readable storage medium 624 (also known as a non-transitory computer-readable medium) on which is stored one or more sets of instructions 626 or software embodying any one or more of the methodologies or functions described herein. The instructions 626 may also reside, completely or at least partially, within the main memory 604 and/or within the processing device 602 during execution thereof by the computer system 600, the main memory 604 and the processing device 602 also constituting machine-readable storage media.

In some implementations, the instructions 626 include instructions to implement functionality corresponding to the present disclosure. While the machine-readable storage medium 624 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 602 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method comprising:

accessing a schematic design of a photonic integrated circuit (PIC), the schematic design specifying a plurality of components and connections between the components; and executing multiple iterations of estimating signal propagation of an input stimulus through the PIC, each iteration comprising estimating outputs of the components from inputs to the components in an order determined by signal flow through the connections in the schematic design, wherein at least one output is estimated by running a simulation of the component;

for at least one component and one iteration: comparing, by a processing device, the input for that iteration against a cached input for the component; and, based on the comparison, determining, by the processing device, whether to retrieve a corresponding cached output for the component or to run the simulation of the component.

2. The method of claim 1, wherein the PIC includes a bidirectional connection and/or a feedback loop.

3. The method of claim 2, further comprising:

for second and later iterations: for components that include both feedforward input and feedback input, estimating the output of the component based on the feedforward input from a current iteration and the feedback input from an immediately previous iteration;

calculating simulation results for the PIC based on the estimated signal propagation of the input stimulus through the PIC; and ending the iterations based on convergence of the simulation results.

4. The method of claim 1, wherein the simulation of the component is characterized by one or more parameters, the method further comprising:

for at least one component and one iteration: also comparing the parameters for that iteration against cached parameters for the component; and, based on the comparison of the inputs and of the parameters, determining whether to retrieve a corresponding cached output for the component or to run the simulation of the component.

5. The method of claim 1, wherein the PIC is characterized by a set of one or more parameters, and different iterations comprise estimating the signal propagation of the input stimulus through the PIC for different values of the parameters.

6. The method of claim 1, wherein the comparison of the input for the current iteration against the cached input is based on an average difference between the inputs and/or based on a peak difference between the inputs.

7. The method of claim 1, wherein determining whether to retrieve the cached output or to run the simulation of the component is not based on a topology of the components and their connections.

8. The method of claim 1, wherein the cached input is an input from a previous iteration.

9. The method of claim 1, wherein the input for the current iteration is compared against multiple cached inputs.

10. The method of claim 1, wherein the input for the current iteration is compared against only a most recently cached input.

11. A system comprising:

a storage sub-system storing:

a schematic design of a photonic integrated circuit (PIC), the schematic design specifying a plurality of components and connections between the components;

a cache of inputs and corresponding outputs for one or more of the components; and program instructions; and a processing device, coupled to the storage sub-system and to execute the program instructions, the program instructions when executed cause the processing device to:

estimate signal propagation of an input stimulus through the PIC by estimating outputs of the components from inputs to the components in an order determined by the connections in the schematic design;

compare the input for at least one component against a cached input for the component; and, based on the comparison, determine whether to retrieve a corresponding cached output for the component or to run a simulation of the component.

12. The system of claim 11, wherein the cache stores inputs and outputs for less than all of the components.

13. The system of claim 11, wherein the cache stores inputs and outputs for components selected based on a run time for the simulation of the component.

14. The system of claim 13, wherein the simulation for one of the selected components is a SPICE simulation.

15. The system of claim 11, further comprising:

an interface to call simulations of components.

16. The system of claim 11, wherein the program instructions when executed further cause the processing device to: determine to run simulations of multiple components, wherein some of the simulations are time-based simulations and other of the simulations are frequency-based simulations.

17. The system of claim 11, wherein the program instructions when executed further cause the processing device to: determine to run simulations of multiple components, and the simulations include electrical simulations, electro-optic simulations and optical simulations.

18. A non-transitory computer readable medium comprising stored instructions, which when executed by a processing device, cause the processing device to:

access a schematic design of a photonic integrated circuit (PIC), the schematic design specifying a plurality of components and connections between the components; and execute multiple iterations of estimating signal propagation of an input stimulus through the PIC, each iteration comprising estimating outputs of the components from inputs to the components in an order determined by a signal flow through the connections in the schematic design, wherein at least one output is estimated by running a simulation of the component; and for at least one component and one iteration: compare the input for that iteration against a cached input for the component; and, based on the comparison, determine whether to by retrieve a corresponding cached output for the component or to run a simulation of the component.

19. The computer readable medium of claim 18, wherein the cached output for the component is from a most recent iteration for which simulation of the component was run.

20. The computer readable medium of claim 18, wherein the system includes a bidirectional connection and/or a feedback loop.

* * * * *